US010007627B2

(12) United States Patent
Feng et al.

(10) Patent No.: US 10,007,627 B2
(45) Date of Patent: Jun. 26, 2018

(54) METHOD AND APPARATUS FOR AUTOMATIC SIGNAL EXCHANGE BETWEEN MULTIPLE EMBEDDED CPU BOARDS

(71) Applicants: NR ELECTRIC CO., LTD., Nanjing, Jiangsu (CN); NR ELECTRIC ENGINEERING CO., LTD., Nanjing, Jiangsu (CN)

(72) Inventors: Yadong Feng, Jiangsu (CN); Qiang Zhou, Jiangsu (CN); Dongfang Xu, Jiangsu (CN); Tao Yuan, Jiangsu (CN); Tianen Zhao, Jiangsu (CN); Guanghua Li, Jiangsu (CN); Jifeng Wen, Jiangsu (CN); Hongjun Chen, Jiangsu (CN); Kejin Liu, Jiangsu (CN)

(73) Assignees: NR Electric Co., Ltd., Nanjing, Jiangsu (CN); NR Electric Engineering Co., Ltd., Nanjing, Jiangsu (CN)

( * ) Notice: Subject to any disclaimer, the term of this patent is extended or adjusted under 35 U.S.C. 154(b) by 284 days.

(21) Appl. No.: 15/039,254

(22) PCT Filed: Nov. 12, 2014

(86) PCT No.: PCT/CN2014/090881
§ 371 (c)(1),
(2) Date: May 25, 2016

(87) PCT Pub. No.: WO2015/090125
PCT Pub. Date: Jun. 25, 2015

(65) Prior Publication Data
US 2017/0075836 A1   Mar. 16, 2017

(30) Foreign Application Priority Data
Dec. 19, 2013   (CN) .......................... 2013 1 0706669

(51) Int. Cl.
*G06F 13/00*   (2006.01)
*G06F 13/362*   (2006.01)
(Continued)

(52) U.S. Cl.
CPC ........ *G06F 13/362* (2013.01); *G06F 13/4282* (2013.01); *G06F 15/17* (2013.01); *G06F 17/50* (2013.01)

(58) Field of Classification Search
CPC .................................................... G06F 13/362
See application file for complete search history.

(56) References Cited

U.S. PATENT DOCUMENTS 7,185,341 B2   2/2007   Van Hensbergen
7,725,663 B2 *   5/2010   Bullman et al. ........ G06F 12/00
(Continued)

FOREIGN PATENT DOCUMENTS

CN   1464415   12/2003
CN   101957808   1/2011

OTHER PUBLICATIONS

International Search Report of PCT/CN2014/090881 dated Mar. 4, 2015, 4 pages (English and Chinese Translations).

*Primary Examiner* — Tammara R Peyton
(74) *Attorney, Agent, or Firm* — Rankin, Hill & Clark LLP

(57) ABSTRACT

A signal name based method for automatic signal exchange between multiple embedded CPU boards, includes: dividing CPU boards into master board and slave board, where each slave board sends signal registration information to the master board; reading an exchange relationship between an output signal and an input signal that is represented by a connection line between signal names, calculating and allocating a data bus address to which the output signal and the input signal are mapped, and sending memory addresses, (Continued)

data types, and bus addresses of signals to each slave board; saving these as output signal tables and input signal tables; and writing, by a signal sender, a value of an output signal into a corresponding bus address according to the output signal tables, and reading, by a receiver, a value of an input signal from a corresponding bus address according to the input signal tables.

13 Claims, 5 Drawing Sheets

(51) Int. Cl.
  *G06F 15/17* (2006.01)
  *G06F 13/42* (2006.01)
  *G06F 17/50* (2006.01)

(56) References Cited

U.S. PATENT DOCUMENTS 9,003,206 B2 * 4/2015 Rickard ............... G06F 1/26
9,344,917 B2 * 5/2016 Zhou et al. ........... H04W 28/08

* cited by examiner

METHOD AND APPARATUS FOR AUTOMATIC SIGNAL EXCHANGE BETWEEN MULTIPLE EMBEDDED CPU BOARDS

BACKGROUND

Technical Field

The present invention relates to the field of embedded systems, and in particular, to a method and an apparatus for implementing automatic signal exchange between multiple CPU boards by using a data bus.

Related Art

With regard to an embedded system formed by two or more CPU boards, the CPU boards implement different functions, and the CPU boards exchange signals by using a data bus, so as to implement distributed computing and cooperative work, as shown in FIG. 1. To implement signal exchange between CPU boards, a common practice is that: during a software programming phase, a same data bus address is first allocated to an output signal and an input signal of the CPU boards that need to be exchanged, and the allocated address is written into programs of the CPU boards. Only when a data bus address of an output part is the same as a data bus address of an input part, correct signal exchange may be implemented. As shown in FIG. 2, both of an output signal Sig1 of a board 1 and an input signal Sig2 of a board 2 use a data bus address x, so as to implement signal exchange. In a process of developing an embedded system, signals and signal exchange are usually adjusted for multiple times (for example, adding, reducing, or changing an order), which requires a signal receiver and a signal sender to simultaneously modify a data bus address and requires recompilation of programs of CPU boards. In a complex system, there may be several tens of thousands signals being exchanged between boards, and an error would easily occur when data bus addresses are manually adjusted. Therefore, with regard to an embedded system formed by multiple CPU boards, how to conveniently and flexibly implement automatic exchange of signals between CPU boards by using a data bus is a challenge.

SUMMARY

An objective of the present invention is to provide a method and an apparatus for automatic signal exchange between multiple embedded CPU boards, which intuitively and simply adjust signal exchange between CPU boards and ensure the correctness of signal exchange. To achieve the foregoing objective, the present invention provides the following solutions:

A signal name based method for automatic signal exchange between multiple embedded CPU boards includes the following steps:

(1) dividing CPU boards in a distributed system of multiple embedded CPU boards into master board and slave board, where a CPU board with a signal management function is used as the master board, and the remaining CPU boards are used as slave boards; and during an initialization phase, each slave board sends signal registration information to the master board;

(2) after the master board collects the signal registration information of all the slave boards, reading, from a configuration file, an exchange relationship between an output signal and an input signal that is represented by a connection line between signal names, calculating and allocating a data bus address to which the output signal and the input signal are mapped, and sending memory addresses, data types, and bus addresses of signals to each slave board;

(3) after a slave board receives the memory addresses, the data types, and the bus addresses of the signals from the master board, saving same as output signal tables and input signal tables; and (4) during an operation phase, writing, by a signal sender, a value of an output signal into a corresponding allocated bus address according to the output signal tables, and reading, by a receiver, a value of an input signal from a corresponding bus address according to the input signal tables.

In the foregoing step (1), each slave board sends signal registration information to the master board by using CAN, RS-485, or Ethernet, and the signal registration information includes a signal name, a signal memory address, and a signal data type.

In the foregoing step (1), during an initialization phase, the master board sends registration start commands to the slave boards in turn, and a slave board that receives a registration start command sends signal registration information to the master board.

In the foregoing step (2), after acquiring the signal registration information of all the slave boards, the master board stores the signal registration information as an output signal registration table and an input signal registration table according to output or input type; storage of the registration tables is performed by using arrays; each array item represents information about one signal, including a signal name string, a number of a board to which the signal belongs, a signal data type, and a signal memory address; and after all the signals are registered, a signal information table is ordered according to signal names.

In the foregoing step (2), the master board reads, from a configuration file, an exchange relationship between an output signal and an input signal that is represented by a connection line between signal names, which includes the following specific content: the master board reads a configuration file, extracts connection lines between signal names one by one, and stores the connection lines as an array of a signal exchange relationship table, where each array item represents one signal connection line; and the master board obtains, by searching, information about signals from the output signal registration table according to output signal names in the signal exchange relationship table, and then reorders items in the signal exchange relationship table according to a board address, a data type, and a memory address order of the output signals, where a specific ordering rule is that: signals with different board numbers are ordered according to the board numbers in ascending order, signals of a same board are ordered according to widths of signal data types in ascending order, and signals of a same board and a same data type are ordered according to memory addresses in ascending order.

An order of the widths of data types in ascending order is: Boolean, single-byte integer, double-byte integer, four-byte integer, and floating-point.

An embodiment of the present invention further provides an apparatus for implementing automatic signal exchange. The apparatus includes a registration module, an allocation module, a storage module, and an execution module (see FIG. 6), where the registration module is configured to enable each slave board to send signal registration information to the master board;

the allocation module is configured to enable the master board to parse a configuration file, to calculate and allocate a data bus address to which an output signal and an input signal are mapped, and to sequentially send memory addresses, data types, and bus addresses of signals to each slave board;

the storage module is configured to enable a slave board to save, after the slave board receives the memory addresses, the data types, and the bus addresses of the signals from the master board, same as output signal tables and input signal tables; and the execution module is configured to, enable a signal sender to write, during an operation phase, a value of an output signal into a corresponding allocated bus address according to the output signal tables, and enable a receiver to read a value of an input signal from a corresponding bus address according to the input signal tables.

In the foregoing solution, the apparatus further includes the registration module, where the registration module is configured to, enable each slave board to send signal registration information to the master board by using CAN, RS-485, or Ethernet, where the signal registration information includes a signal name, a signal memory address, and a signal data type, enable, during an initialization phase, the master board to send a registration start command to each slave board, and enable a slave board that receives a registration start command to send signal registration information to the master board.

In the foregoing solution, the apparatus further includes the allocation module, where the allocation module is configured to, enable the master board to store, after acquiring the signal registration information of all the slave boards, the signal registration information as an output signal registration table and an input signal registration table according to an output type and an input type, where storage of the registration tables is performed by using arrays; each array item represents information about one signal, including a signal name string, a number of a board to which the signal belongs, a signal data type, and a signal memory address; and after all the signals are registered, a signal information table is ordered according to signal names.

The foregoing allocation module is specifically configured to, enable the master board to read, from a configuration file, an exchange relationship between an output signal and an input signal that is represented by a connection line between signal names, which includes the following specific content: the master board reads a configuration file, extracts connection lines between signal names one by one, and stores the connection lines as an array of a signal exchange relationship table, where each array item represents one signal connection line; and enable the master board to obtain, by searching, information about signals from the output signal registration table according to output signal names in the signal exchange relationship table, and then to reorder items in the signal exchange relationship table according to a board address, a data type, and a memory address order of the output signals, where a specific ordering rule is that: signals with different board numbers are ordered according to the board numbers in ascending order, signals of a same board are ordered according to widths of signal data types in ascending order, and signals of a same board and a same data type are ordered according to memory addresses in ascending order; and an order of the widths of data types in ascending order is: Boolean, single-byte integer, double-byte integer, four-byte integer, and floating-point.

In the foregoing solution, the apparatus further includes the storage module, where the storage module is configured to enable a slave board to save, after the slave board receives the memory addresses, the data types, and the bus addresses of the signals from the master board, same as output signal tables and input signal tables, where the saving of the output signal tables and the input signal tables is performed according to the data types, and the data types include Boolean, single-byte integer, double-byte integer, four-byte integer, and floating-point.

In the foregoing solution, the apparatus further includes the execution module, where the execution module is configured to, enable a signal sender to write, during an operation phase, a value of an output signal into a corresponding allocated data bus address according to the output signal tables, and enable a receiver to read a value of an input signal from a corresponding data bus address according to the input signal tables, where an output part sequentially writes values of all the output signals into corresponding bus addresses according to content in the output signal tables, and each slave board sequentially traverses the output signal tables of Boolean, single-byte integer, double-byte integer, four-byte integer, and floating-point signals, so as to write all the output signals into the bus, as shown in FIG. 5; and an input part sequentially reads the values in the bus addresses into addresses of the input signals according to content in the input signal tables, and each slave board sequentially traverses the input signal tables of Boolean, single-byte integer, double-byte integer, four-byte integer, and floating-point signals, so as to obtain values of all the input signals from the data bus, as shown in FIG. 5.

With the foregoing solutions, in the present invention, during an initialization phase, each slave board sends signal registration information to the master board, an exchange relationship between an output signal and an input signal is represented by using a connection line between signal names, connection lines between signal names are stored in a configuration file, the master board parses signal exchange relationships in the configuration file, automatic calculates and allocates data bus addresses of output signals and input signals, and sends memory addresses, data types, and bus addresses of signals to each slave board, and a slave board saves the memory addresses, the data types, and the bus addresses of the output signals and the input signals as output signal tables and input signal tables; and during an operation, a signal sender writes a value of a signal into a corresponding allocated bus address according to the output signal tables, and a receiver reads a value of an input signal from a specific data bus address according to the input signal tables. Therefore, the difficulty of manually adjusting signal exchange is eliminated, the risk of a human error is avoided, and the correctness of signal exchange between multiple CPU boards is ensured from a mechanism aspect. In addition, adjusting signal exchange between CPU boards according to signal names may be implemented by editing a configuration file, which is intuitive and simple and does not need to modify programs of CPU boards, thereby simplifying the development and design of an embedded system.

DETAILED DESCRIPTION

The technical solutions of the present invention are described in detail below with reference to accompany drawings.

Figure 1:
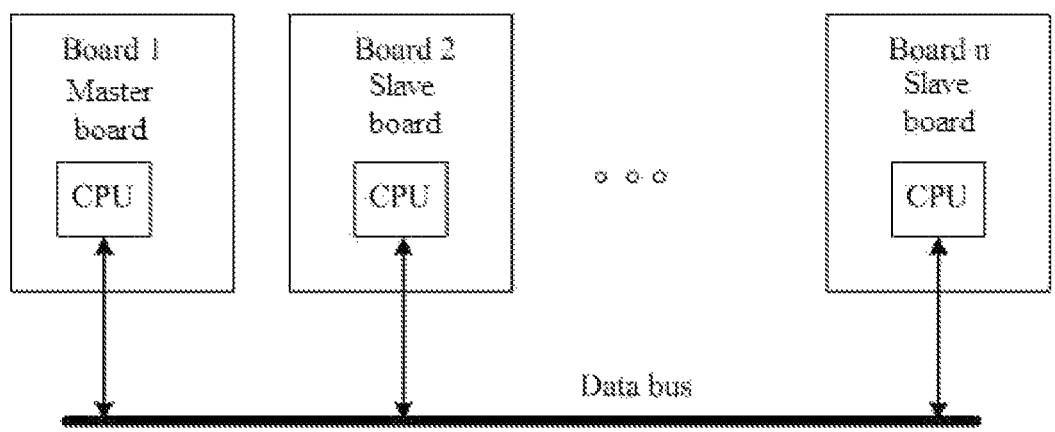
FIG. 1 is a structural diagram of a structure of a distributed system of multiple embedded CPU boards according to the present invention.
Figure 2:
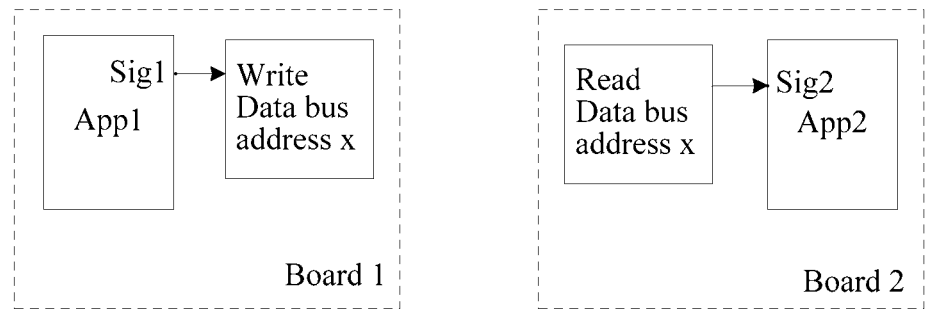
FIG. 2 is a schematic diagram of a current method for implementing signal exchange between multiple CPU boards based on a manual fixed allocated data bus address.
Figure 3:
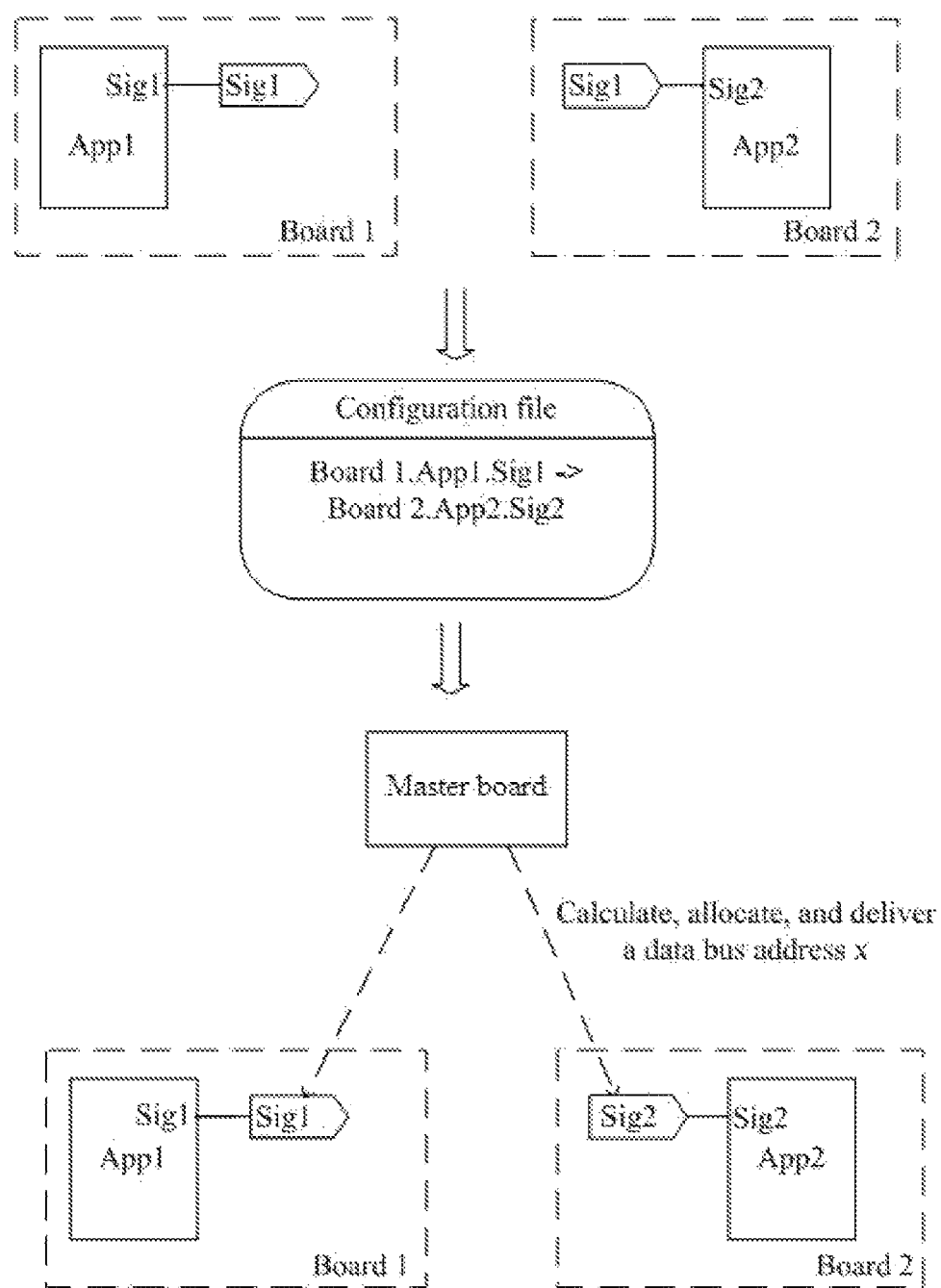
FIG. 3 is a schematic diagram of a signal name based method for implementing automatic signal exchange between multiple CPU boards according to the present invention.

As shown in FIG. 3, the present invention provides a signal name based method for automatic signal exchange between multiple embedded CPU boards, including the following steps:

(1) CPU boards in a distributed system of multiple embedded CPU boards (the architecture thereof is shown in FIG. 1) are divided into master board and slave board, where one CPU board thereof is used as the master board, and the remaining CPU boards are used as slave boards, so as to form a "master and slave" system architecture.

Figure 4:
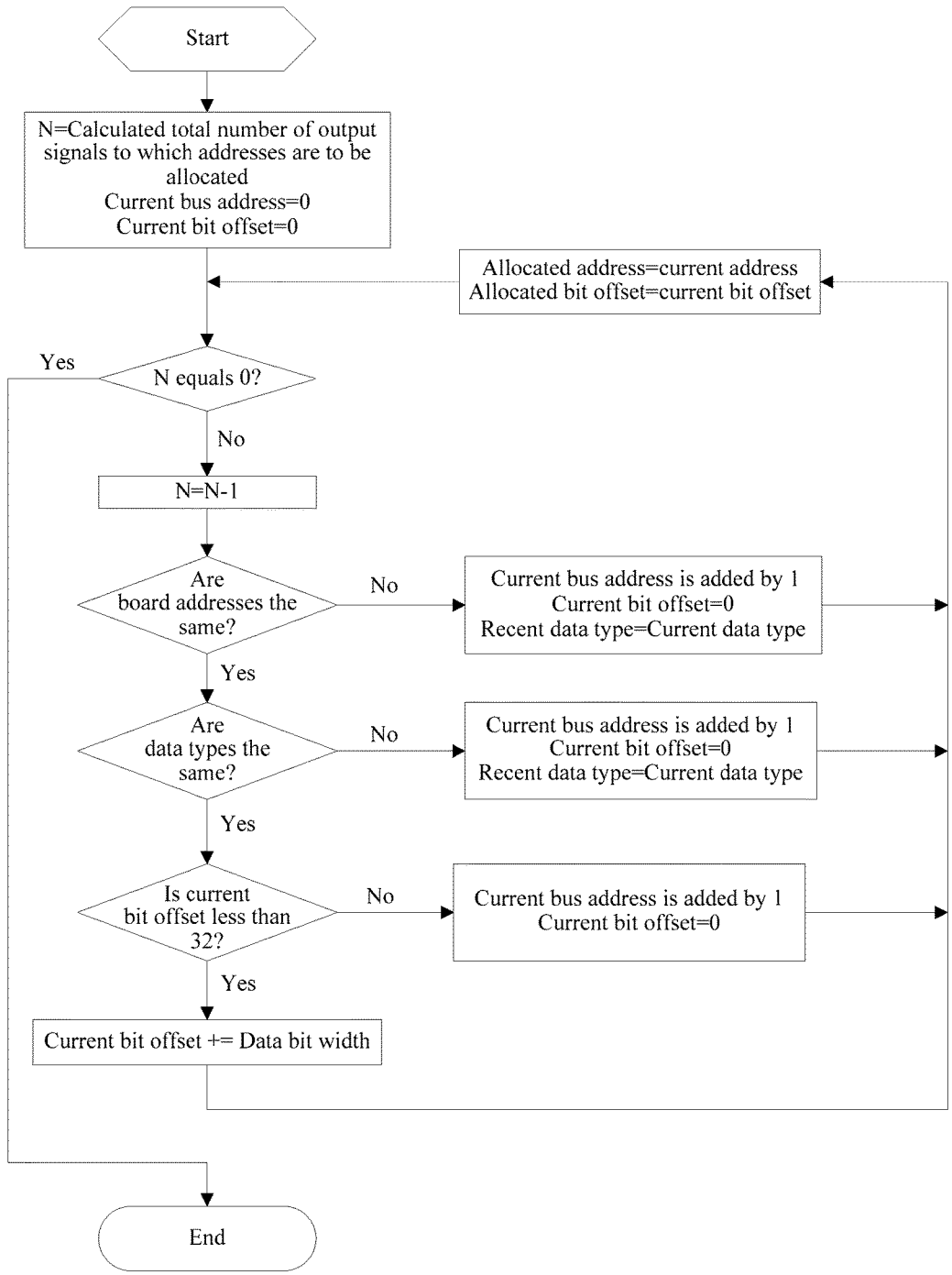
FIG. 4 is a schematic diagram of signal registration, and calculation and allocation of a data bus address during an initialization phase.

After the distributed system of multiple embedded CPU boards is powered on, the CPU boards first initialize hardware, and then perform signal registration, that is, information about a signal that a slave board needs to exchange with the outside is sent to the master board by using a communications bus, and specifically, by using CAN, RS-485, Ethernet, and the like. The information about a signal includes a signal name, a signal memory address, and a signal data type. To avoid a state that multiple slave boards simultaneously send signal information to the master board, thereby exceeding a receiving capability of the master board, a method that the master board sends registration start commands to the slave boards in turn so as to allow the slave boards to sequentially perform registration is adopted, as shown in FIG. 4.

(2) After collecting the signal registration information of all the slave boards, the master board stores the signal registration information as an output signal registration table and an input signal registration table according to an output type and an input type, where storage of the registration tables is performed by using arrays; each array item represents information about one signal, including a signal name string, a number of a board to which the signal belongs, a signal data type, and a signal memory address; and after all the signals are registered, a signal information table is ordered according to signal names.

The master board reads a configuration file with a structure below:

B01.Sig1->B02.Sig2
B01.Sig1->B03.Sig0
B02.Sig1->B01.Sig4
. . .

The master board reads a configuration file, extracts connection lines between signal names one by one, and stores the connection lines as an array of a signal exchange relationship table, where each array item represents one signal connection line (an output signal name string, an input signal name string).

The master board obtains, by searching, information about signals (including board numbers, data types, and memory addresses) from the output signal registration table according to output signal names in the signal exchange relationship table, and then reorders items in the signal exchange relationship table according to a board address, a data type, and a memory address order of the output signals, where a specific ordering rule is that: board numbers are ordered in descending order, data types of signals with a same board number are ordered according to widths of the data types in ascending order (Boolean, single-byte integer, double-byte integer, four-byte integer, and floating-point), and memory addresses of signals of a same board and a same data type are ordered in ascending order. After the ordering is completed, in the signal exchange relationship table, signals of a same board are arranged adjacent to each other, and signals of a same board and a same data type are arranged adjacent to each other.

The master board reads the ordered output signals in the signal exchange relationship table, and allocates data bus addresses. According to an ordering result, the bus addresses allocated to the boards are ordered in ascending order according to the board numbers.

After the data bus addresses of the output signals are successfully allocated, the master board finds, by using the signal exchange relationship table, input signals associated with the output signals, so as to automatically obtain the data bus addresses of the input signals.

(3) After calculating and allocating the addresses to the output signals, the master board delivers information about the addresses of the signals to the slave boards, where information related to an output signal includes an output signal memory address, a signal data type, and a data bus address, and information related to an input signal includes a signal memory address, a signal data type, and a data bus address. After receiving the information about addresses from the master board, a slave board separately saves same as output signal tables and input signal tables.

The output signal tables are divided into output signal tables of Boolean, single-byte integer, double-byte integer, four-byte integer, and floating-point signals according to signal types, and a signal table of each type is formed by the number of output signals, output signal memory address, and data bus address.

The input signal tables are divided into input signal tables of Boolean, single-byte integer, double-byte integer, four-byte integer, and floating-point signals according to signal types, and a signal table of each type is formed by the number of input signals, input signal memory address, and data bus address.

(4) After each slave board establishes the output signal tables and the input signal tables during the initialization phase, during an operation phase, a signal sender writes, according to the output signal tables, a value of an output signal into a corresponding allocated data bus address, and a receiver reads, according to the input signal tables, a value of an input signal from a corresponding data bus address.

Figure 5:
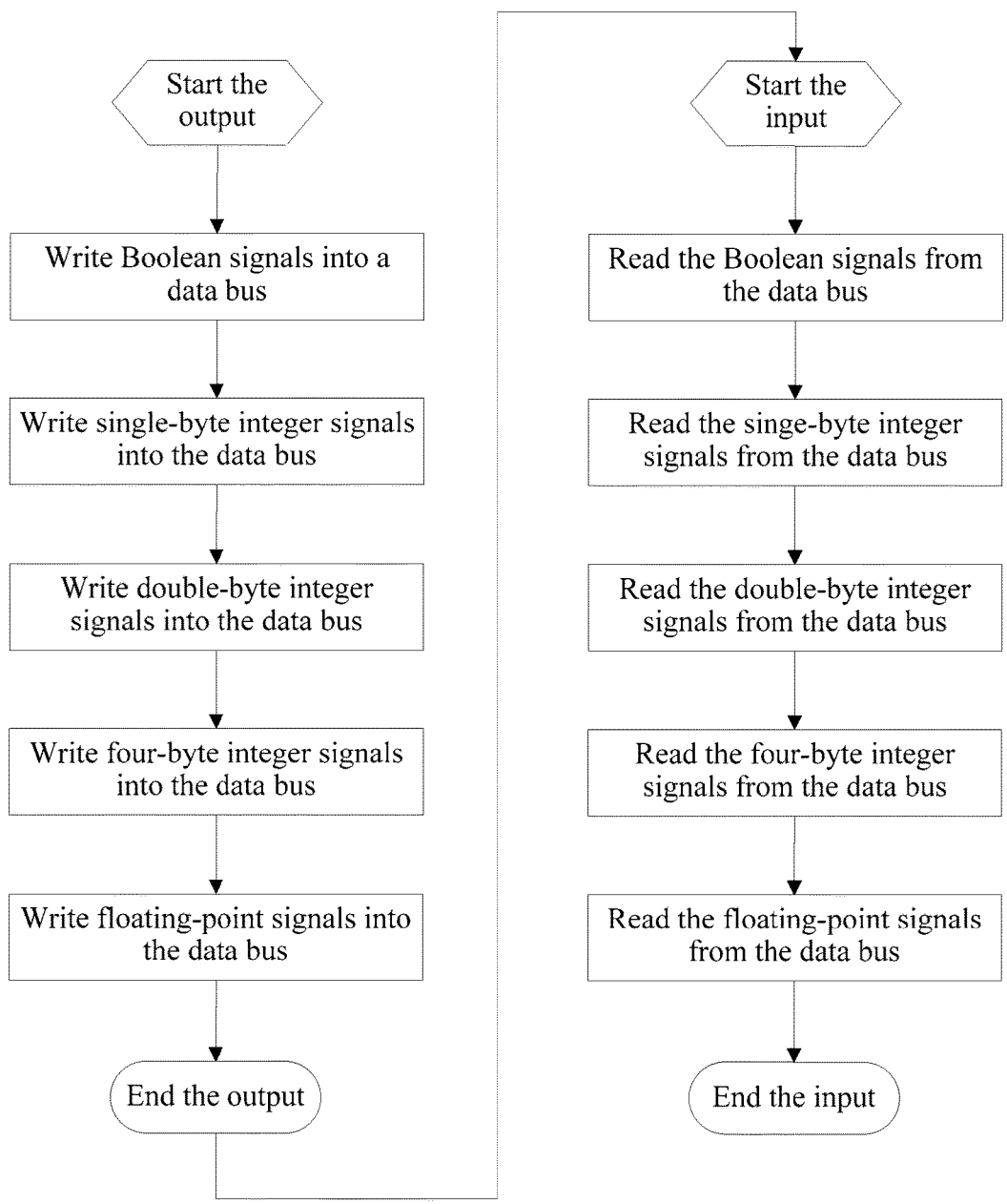
FIG. 5 is a schematic diagram of update of output signals and input signals during an operation phase.

An output part sequentially writes values of all the output signals into corresponding bus addresses according to content in the output signal tables, and each slave board sequentially traverses the output signal tables of Boolean, single-byte integer, double-byte integer, four-byte integer, and floating-point signals, so as to write all the output signals into the bus, as shown in FIG. 5.

An input part sequentially reads the values in the bus addresses into addresses of the input signals according to content in the input signal tables, and each slave board sequentially traverses the input signal tables of Boolean, single-byte integer, double-byte integer, four-byte integer, and floating-point signals, so as to obtain values of all the input signals from the data bus, as shown in FIG. 5.

Figure 6:
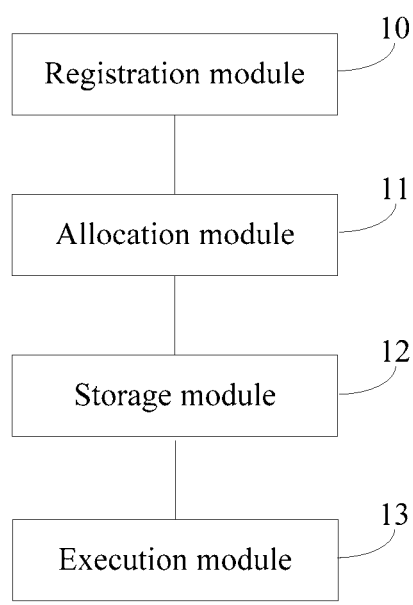
FIG. 6 is a schematic structural diagram of composition of an apparatus for implementing automatic signal exchange according to an embodiment of the present invention.

FIG. 6 is a schematic structural diagram of composition of an apparatus for implementing automatic signal exchange according to an embodiment of the present invention. As shown in FIG. 6, an apparatus for implementing automatic signal exchange according to an embodiment of the present invention includes: a registration module 10, an allocation module 11, a storage module 12, and an execution module 13, where the registration module 10 is configured to enable each slave board to send signal registration information to the master board;

the allocation module 11 is configured to, enable the master board to parse a configuration file, to calculate and allocate a data bus address to which an output signal and an input signal are mapped, and to sequentially send memory addresses, data types, and bus addresses of signals to each slave board;

the storage module 12 is configured to enable a slave board to save, after the slave board receives the memory addresses, the data types, and the bus addresses of the signals from the master board, same as output signal tables and input signal tables; and the execution module 13 is configured to, enable a signal sender to write, during an operation phase, a value of an output signal into a corresponding allocated bus address according to the output signal tables, and enable a receiver to read a value of an input signal from a corresponding bus address according to the input signal tables.

Specifically, the registration module is configured to, enable each slave board to send signal registration information to the master board by using CAN, RS-485, or Ethernet, where the signal registration information includes a signal name, a signal memory address, and a signal data type, enable, during an initialization phase, the master board to send a registration start command to each slave board, and enable a slave board that receives a registration start command to send signal registration information to the master board.

Specifically, the allocation module is configured to, enable the master board to store, after acquiring the signal registration information of all the slave boards, the signal registration information as an output signal registration table and an input signal registration table according to an output type and an input type, where storage of the registration tables is performed by using arrays; each array item represents information about one signal, including a signal name string, a number of a board to which the signal belongs, a signal data type, and a signal memory address; and after all the signal are registered, a signal information table is ordered according to signal names.

The master board reads, from a configuration file, an exchange relationship between an output signal and an input signal that is represented by a connection line between signal names, which includes the following specific content: the master board reads a configuration file, extracts connection lines between signal names one by one, and stores the connection lines as an array of a signal exchange relationship table, where each array item represents one signal connection line; and the master board obtains, by searching, information about signals from the output signal registration table according to output signal names in the signal exchange relationship table, and then reorders items in the signal exchange relationship table according to a board address, a data type, and a memory address order of the output signals, where a specific ordering rule is that: signals with different board numbers are ordered according to the board numbers in ascending order, signals of a same board are ordered according to widths of signal data types in ascending order, and signals of a same board and a same data type are ordered according to memory addresses in ascending order. An order of the widths of data types in ascending order is: Boolean, single-byte integer, double-byte integer, four-byte integer, and floating-point.

Specifically, the storage module is configured to enable a slave board to save, after the slave board receives the memory addresses, the data types, and the bus addresses of the signals from the master board, same as output signal tables and input signal tables, where the saving of the output signal tables and the input signal tables is performed according to the data types, and the data types include Boolean, single-byte integer, double-byte integer, four-byte integer, and floating-point.

Specifically, the execution module is configured to, enable a signal sender to write, during an operation phase, a value of an output signal into a corresponding allocated data bus address according to the output signal tables, and enable a receiver to read a value of an input signal from a corresponding data bus address according to the input signal tables.

An output part sequentially writes values of all the output signals into corresponding bus addresses according to content in the output signal tables, and each slave board sequentially traverses the output signal tables of Boolean, single-byte integer, double-byte integer, four-byte integer, and floating-point signals, so as to write all the output signals into the bus, as shown in FIG. 5.

An input part sequentially reads the values in the bus addresses into addresses of the input signals according to content in the input signal table, and each slave board sequentially traverses the input signal tables of Boolean, single-byte integer, double-byte integer, four-byte integer, and floating-point signals, so as to obtain values of all the input signals from the data bus, as shown in FIG. 5.

When signal exchange between multiple CPUs changes, only a configuration file needs to be adjusted; after a system is restarted, the master board reads the configuration file, automatic calculates and allocates bus addresses again, and delivers same; and the slave boards automatically obtain the newest data bus addresses. Therefore, no manual adjustment and modification of bus addresses is needed, and a possibility of an error is eliminated.

In practical applications, the registration module 10, the allocation module 11, the storage module 12, and the execution module 13 may all be implemented by a central processing unit (CPU), a micro processing unit (MPU), a digital signal processor (DSP), or a field programmable gate array (FPGA) of a server or a terminal at which an apparatus for implementing logic programming of the present invention is located.

The foregoing embodiments are merely intended to describe the technical thought of the present invention, and are not intended to limit the protection scope of the present invention. Any technical thought provided according to the present invention, and any variation made on the basis of the technical solutions all fall within the protection scope of the present invention.

What is claimed:

1. A method for automatic signal exchange between multiple embedded CPU boards, comprising the following steps:

(1) dividing CPU boards in a distributed system of multiple embedded CPU boards into master board and slave board, wherein a CPU board with a signal management function is used as the master board, and the remaining CPU boards are used as slave boards; and during an initialization phase, each slave board sends signal registration information to the master board;

(2) after the master board collects the signal registration information of all the slave boards, reading, from a configuration file, an exchange relationship between an output signal and an input signal that is represented by a connection line between signal names, calculating and allocating a data bus address to which the output signal and the input signal are mapped, and sending memory addresses, data types, and bus addresses of signals to each slave board;

(3) after a slave board receives the memory addresses, the data types, and the bus addresses of the signals from the master board, saving same as output signal tables and input signal tables; and (4) during an operation phase, writing, by a signal sender, a value of an output signal into a corresponding allocated bus address according to the output signal tables, and reading, by a receiver, a value of an input signal from a corresponding bus address according to the input signal tables.

2. The method for automatic signal exchange between multiple embedded CPU boards according to claim 1, wherein in step (1), each slave board sends signal registration information to the master board by using CAN, RS-485, or Ethernet, and the signal registration information comprises a signal name, a signal memory address, and a signal data type.

3. The method for automatic signal exchange between multiple embedded CPU boards according to claim 1, wherein in step (1), during an initialization phase, the master board sends a registration start command to each slave board, and a slave board that receives a registration start command sends signal registration information to the master board.

4. The method for automatic signal exchange between multiple embedded CPU boards according to claim 1, wherein in step (2), after acquiring the signal registration information of all the slave boards, the master board stores the signal registration information as an output signal registration table and an input signal registration table according to an output type and an input type; storage of the registration tables is performed by using arrays; each array item represents information about one signal, comprising a signal name string, a number of a board to which the signal belongs, a signal data type, and a signal memory address; and after all the signals are registered, a signal information table is ordered according to signal names.

5. The method for automatic signal exchange between multiple embedded CPU boards according to claim 4, wherein in step (2), the master board reads, from a configuration file, an exchange relationship between an output signal and an input signal that is represented by a connection line between signal names, which comprises the following specific content: the master board reads a configuration file, extracts connection lines between signal names one by one, and stores the connection lines as an array of a signal exchange relationship table, wherein each array item represents one signal connection line; and the master board obtains, by searching, information about signals from the output signal registration table according to output signal names in the signal exchange relationship table, and then reorders items in the signal exchange relationship table according to a board address, a data type, and a memory address order of the output signals, wherein a specific ordering rule is that: signals with different board numbers are ordered according to the board numbers in ascending order, signals of a same board are ordered according to widths of signal data types in ascending order, and signals of a same board and a same data type are ordered according to memory addresses in ascending order.

6. The method for automatic signal exchange between multiple embedded CPU boards according to claim 5, wherein an order of the widths of data types in ascending order is: Boolean, single-byte integer, double-byte integer, four-byte integer, and floating-point.

7. An apparatus for automatic signal exchange, comprising: a registration module, an allocation module, a storage module, and an execution module, wherein the registration module is configured to enable each slave board to send signal registration information to the master board;

the allocation module is configured to enable the master board to parse a configuration file, to calculate and allocate a data bus address to which an output signal and an input signal are mapped, and to sequentially send memory addresses, data types, and bus addresses of signals to each slave board;

the storage module is configured to enable a slave board to save, after the slave board receives the memory addresses, the data types, and the bus addresses of the signals from the master board, same as output signal tables and input signal tables; and the execution module is configured to, enable a signal sender to write, during an operation phase, a value of an output signal into a corresponding allocated bus address according to the output signal tables, and enable a receiver to read a value of an input signal from a corresponding bus address according to the input signal tables.

8. The apparatus according to claim 7, wherein the apparatus further comprises: the registration module, wherein the registration module is configured to, enable each slave board to send signal registration information to the master board by using CAN, RS-485, or Ethernet, wherein the signal registration information comprises a signal name, a signal memory address, and a signal data type, enable, during an initialization phase, the master board to send a registration start command to each slave board, and enable a slave board that receives a registration start command to send signal registration information to the master board.

9. The apparatus according to claim 7, wherein the apparatus further comprises: the allocation module, wherein the allocation module is configured to, enable the master board to store, after acquiring the signal registration information of all the slave boards, the signal registration information as an output signal registration table and an input signal registration table according to an output type and an input type, wherein storage of the registration tables is performed by using arrays; each array item represents information about one signal, comprising a signal name string, a number of a board to which the signal belongs, a signal data type, and a signal memory address; and after all the signals are registered, a signal information table is ordered according to signal names.

10. The apparatus according to claim 7, wherein the allocation module is specifically configured to, enable the master board to read, from a configuration file, an exchange relationship between an output signal and an input signal that is represented by a connection line between signal names, which comprises the following specific content: the master board reads a configuration file, extracts connection lines between signal names one by one, and stores the connection lines as an array of a signal exchange relationship table, wherein each array item represents one signal connection line; and enable the master board to obtain, by searching, information about signals from the output signal registration table according to output signal names in the signal exchange relationship table, and then to reorder items in the signal exchange relationship table according to a board address, a data type, and a memory address order of the output signals, wherein a specific ordering rule is that: signals with different board numbers are ordered according to the board numbers in ascending order, signals of a same board are ordered according to widths of signal data types in ascending order, and signals of a same board and a same data type are ordered according to memory addresses in ascending order; and an order of the widths of data types in ascending order is: Boolean, single-byte integer, double-byte integer, four-byte integer, and floating-point.

11. The apparatus according to claim 7, wherein the apparatus further comprises: the storage module, wherein
the storage module is configured to enable a slave board to save, after the slave board receives the memory addresses, the data types, and the bus addresses of the signals from the master board, same as output signal tables and input signal tables, wherein the saving of the output signal tables and the input signal tables is performed according to the data types, and the data types comprise Boolean, single-byte integer, double-byte integer, four-byte integer, and floating-point.

12. The apparatus according to claim 7, wherein the apparatus further comprises: the execution module, wherein
the execution module is configured to, enable a signal sender to write, during an operation phase, a value of an output signal into a corresponding allocated data bus address according to the output signal tables, and enable a receiver to read a value of an input signal from a corresponding data bus address according to the input signal tables, wherein
an output part sequentially writes values of all the output signals into corresponding bus addresses according to content in the output signal tables, and each slave board sequentially traverses the output signal tables of Boolean, single-byte integer, double-byte integer, four-byte integer, and floating-point signals, so as to write all the output signals into the bus; and
an input part sequentially reads the values in the bus addresses into addresses of the input signals according to content in the input signal table, and each slave board sequentially traverses the input signal tables of Boolean, single-byte integer, double-byte integer, four-byte integer, and floating-point signals, so as to obtain values of all the input signals from the data bus.

13. The apparatus according to claim 9, wherein the allocation module is specifically configured to, enable the master board to read, from a configuration file, an exchange relationship between an output signal and an input signal that is represented by a connection line between signal names, which comprises the following specific content: the master board reads a configuration file, extracts connection lines between signal names one by one, and stores the connection lines as an array of a signal exchange relationship table, wherein each array item represents one signal connection line; and enable the master board to obtain, by searching, information about signals from the output signal registration table according to output signal names in the signal exchange relationship table, and then to reorder items in the signal exchange relationship table according to a board address, a data type, and a memory address order of the output signals, wherein a specific ordering rule is that: signals with different board numbers are ordered according to the board numbers in ascending order, signals of a same board are ordered according to widths of signal data types in ascending order, and signals of a same board and a same data type are ordered according to memory addresses in ascending order; and an order of the widths of data types in ascending order is: Boolean, single-byte integer, double-byte integer, four-byte integer, and floating-point.

* * * * *